(12) United States Patent
Isoya (10) Patent No.: US 12,167,578 B2
(45) Date of Patent: Dec. 10, 2024

(54) COOLING SYSTEM AND ELECTRONIC DEVICE

(71) Applicant: NEC Platforms, Ltd., Kawasaki (JP)

(72) Inventor: Satoshi Isoya, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 216 days.

(21) Appl. No.: 17/772,819

(22) PCT Filed: Oct. 30, 2020

(86) PCT No.: PCT/JP2020/040869
§ 371 (c)(1),
(2) Date: Apr. 28, 2022

(87) PCT Pub. No.: WO2021/095572
PCT Pub. Date: May 20, 2021

(65) Prior Publication Data
US 2022/0408608 A1   Dec. 22, 2022

(30) Foreign Application Priority Data

Nov. 13, 2019   (JP) .................................. 2019-205337

(51) Int. Cl.
*H05K 7/20*   (2006.01)

(52) U.S. Cl.
CPC ..... *H05K 7/20772* (2013.01); *H05K 7/20272* (2013.01)

(58) Field of Classification Search
CPC ..................... H05K 7/20272; H05K 7/20772
USPC .................................................... 361/679.53
See application file for complete search history.

(56) References Cited

U.S. PATENT DOCUMENTS

| | | | | |
|---|---|---|---|---|
| 5,052,472 A | * | 10/1991 | Takahashi | F25B 49/025 257/E23.098 |
| 5,422,787 A | * | 6/1995 | Gourdine | H05K 7/20154 361/695 |
| 7,007,506 B2 | * | 3/2006 | Kubo | H05K 7/20309 165/170 |

(Continued)

FOREIGN PATENT DOCUMENTS

| | | |
|---|---|---|
| JP | H03-208398 A | 9/1991 |
| JP | H05-160310 A | 6/1993 |

(Continued)

OTHER PUBLICATIONS

International Search Report for PCT Application No. PCT/JP2020/040869, mailed on Dec. 22, 2020.

(Continued)

*Primary Examiner* — Anatoly Vortman (57) ABSTRACT

A cooling system includes a first module provided with a substrate, a heat generating member, and a cooling member, a second module provided on a first side of a housing in a depth direction with respect to the first module and provided with a substrate, a heat generating member, and a cooling member, an upstream side tube configured to supply a cooling medium to the cooling member of the first module from an outside, a downstream side tube configured to supply the cooling medium passed through the cooling member of the first module to the cooling member of the second module, and a discharge tube configured to discharge the cooling medium passed through the first module and the second module.

6 Claims, 7 Drawing Sheets

(56) References Cited

U.S. PATENT DOCUMENTS

| | | | | |
|---|---|---|---|---|
| 7,240,722 | B2* | 7/2007 | Lai | H01L 23/427 |
| | | | | 165/80.4 |
| 7,318,322 | B2* | 1/2008 | Ota | H05K 7/20781 |
| | | | | 62/305 |
| 7,325,591 | B2* | 2/2008 | Duan | H01L 23/473 |
| | | | | 257/E23.098 |
| 7,957,148 | B1* | 6/2011 | Gallarelli | H01L 23/32 |
| | | | | 174/16.3 |
| 8,240,362 | B2* | 8/2012 | Eriksen | H05K 7/20263 |
| | | | | 165/80.4 |
| 8,245,764 | B2* | 8/2012 | Eriksen | H01L 23/473 |
| | | | | 165/80.4 |
| 8,289,701 | B2* | 10/2012 | Suzuki | G06F 1/203 |
| | | | | 361/679.55 |
| 8,305,754 | B2* | 11/2012 | Wu | F28D 15/0275 |
| | | | | 361/689 |
| 8,405,975 | B2* | 3/2013 | Helberg | G06F 1/203 |
| | | | | 361/679.55 |
| 8,760,863 | B2* | 6/2014 | Campbell | H05K 7/20781 |
| | | | | 361/679.01 |
| 9,215,832 | B2* | 12/2015 | Chang | H05K 7/20636 |
| 9,345,169 | B1* | 5/2016 | Campbell | H05K 7/20327 |
| 9,462,728 | B2* | 10/2016 | Demange | H05K 7/20254 |
| 9,468,132 | B2* | 10/2016 | Taguchi | H05K 7/20209 |
| 9,575,521 | B1* | 2/2017 | North | H05K 7/20772 |
| 10,201,115 | B2* | 2/2019 | Johnson | H05K 7/20772 |
| 10,739,084 | B2* | 8/2020 | Tsai | H05K 7/20254 |
| 10,925,187 | B1* | 2/2021 | Coxe, III | H05K 7/20836 |
| 2001/0000880 | A1* | 5/2001 | Chu | F25B 43/00 |
| | | | | 62/509 |
| 2004/0008483 | A1* | 1/2004 | Cheon | G06F 1/20 |
| | | | | 361/699 |
| 2004/0057211 | A1* | 3/2004 | Kondo | G06F 1/20 |
| | | | | 361/696 |
| 2005/0083657 | A1 | 4/2005 | Hamman | |
| 2005/0241806 | A1* | 11/2005 | Liu | H01L 23/427 |
| | | | | 165/104.21 |
| 2005/0244280 | A1 | 11/2005 | Malone et al. | |
| 2006/0002086 | A1 | 1/2006 | Teneketges et al. | |
| 2008/0163631 | A1 | 7/2008 | Campbell et al. | |
| 2010/0313590 | A1 | 12/2010 | Campbell et al. | |
| 2013/0008628 | A1* | 1/2013 | Tiengtum | G01R 1/0458 |
| | | | | 248/224.7 |
| 2014/0198453 | A1 | 7/2014 | Zhang et al. | |
| 2015/0146376 | A1* | 5/2015 | Taguchi | F28F 27/02 |
| | | | | 361/699 |
| 2017/0127575 | A1* | 5/2017 | Lunsman | H05K 7/20263 |
| 2018/0279510 | A1* | 9/2018 | Johnson | H05K 7/20772 |
| 2018/0340744 | A1* | 11/2018 | Tsai | F28D 15/00 |
| 2019/0246523 | A1 | 8/2019 | Boyden et al. | |

FOREIGN PATENT DOCUMENTS

| | | |
|---|---|---|
| JP | 2003-243592 A | 8/2003 |
| JP | 2004-103886 A | 4/2004 |
| JP | 2005-315255 A | 11/2005 |
| JP | 2007-281279 A | 10/2007 |
| JP | 2008-509542 A | 3/2008 |
| JP | 2010-258009 A | 11/2010 |
| JP | 2012-529759 A | 11/2012 |
| JP | 2013-225599 A | 10/2013 |
| JP | 2014-525724 A | 9/2014 |
| JP | 2017-004364 A | 1/2017 |
| WO | 2010/142505 A1 | 12/2010 |

OTHER PUBLICATIONS

JP Office Action for JP Application No. JP2019-205337, mailed on Dec. 22, 2020 with English Translation.

Japanese Office Action for JP Application No. 2019-205337 mailed on May 31, 2022 with English Translation.

Extended European Search Report for EP Application No. 20886338.1, dated on Oct. 24, 2023.

* cited by examiner

COOLING SYSTEM AND ELECTRONIC DEVICE

This application is a National Stage Entry of PCT/JP2020/040869 filed on Oct. 30, 2020, which claims priority from Japanese Patent Application 2019-205337 filed on Nov. 13, 2019, the contents of all of which are incorporated herein by reference, in their entirety.

TECHNICAL FIELD

The present invention relates to a cooling system and an electronic device.

BACKGROUND ART

Various electronic devices house a plurality of electronic components in a housing. A liquid cooling scheme is adopted in which the electronic components having high heat generation among the plurality of electronic components housed in the housing are cooled by a coolant.

For example, Patent Document 1 discloses a configuration including a liquid-cooled cooling structure and a heat transfer element for cooling a heat generating component (heat generating member) of an electronic subsystem (module) docked in a housing. The liquid-cooled cooling structure includes a coolant carrying channel. The heat transfer element is coupled to the heat generating component and physically contacts the liquid-cooled cooling structure. In addition, Patent Document 1 discloses a configuration in which the coolant carrying channel of the liquid-cooled cooling structure is provided in each of electronic subsystems docked in a plurality of housings fixed to an electronic device rack.

PRIOR ART DOCUMENT

Patent Document

Patent Document 1: Published Japanese Translation No. 2012-529759 of the PCT International Publication

SUMMARY

Problems to be Solved by the Invention

In the configuration disclosed in Patent Document 1, tubes forming the coolant carrying channel are provided in accordance with the number of housings (electronic subsystems) fixed to the electronic device rack. As the number of coolant carrying channels increases, the number of tubes for transporting the cooling medium increases, and material cost and labor for assembling are required. In particular, when a plurality of electronic subsystems are provided in one housing, the number of tubes forming the coolant carrying channel is provided in accordance with the electronic subsystems provided in the housing. As a result, the material cost and the labor for assembling are further increased, and it may be difficult to secure the space for providing a great number of tubes.

An example object of the present invention is to provide a cooling system and an electronic device that solve any of the above-described problems.

Means for Solving the Problems

A cooling system according to a first example aspect of the present invention is provided with a first module provided in a housing and provided with a first substrate, a first heat generating member mounted on the first substrate, and a cooling member that cools the first heat generating member, a second module provided on a first side of the housing in a depth direction with respect to the first module in the housing, and provided with a second substrate, a second heat generating member mounted on the second substrate, and a cooling member that cools the second heat generating member, an upstream side tube configured to supply a cooling medium to the cooling member of the first module from an outside, a downstream side tube configured to supply the cooling medium passed through the cooling member of the first module to the cooling member of the second module, and a discharge tube configured to discharge the cooling medium passed through the first module and the second module.

An electronic device according to a second example aspect of the present invention is provided with the housing and the cooling system.

Example Advantageous Effects of Invention

According to the first example aspect and the second example aspect described above, the number of tubes can be reduced.

EXAMPLE EMBODIMENT

A plurality of example embodiments of the present invention will be described below with reference to the drawings.

First Example Embodiment

Figure 1:
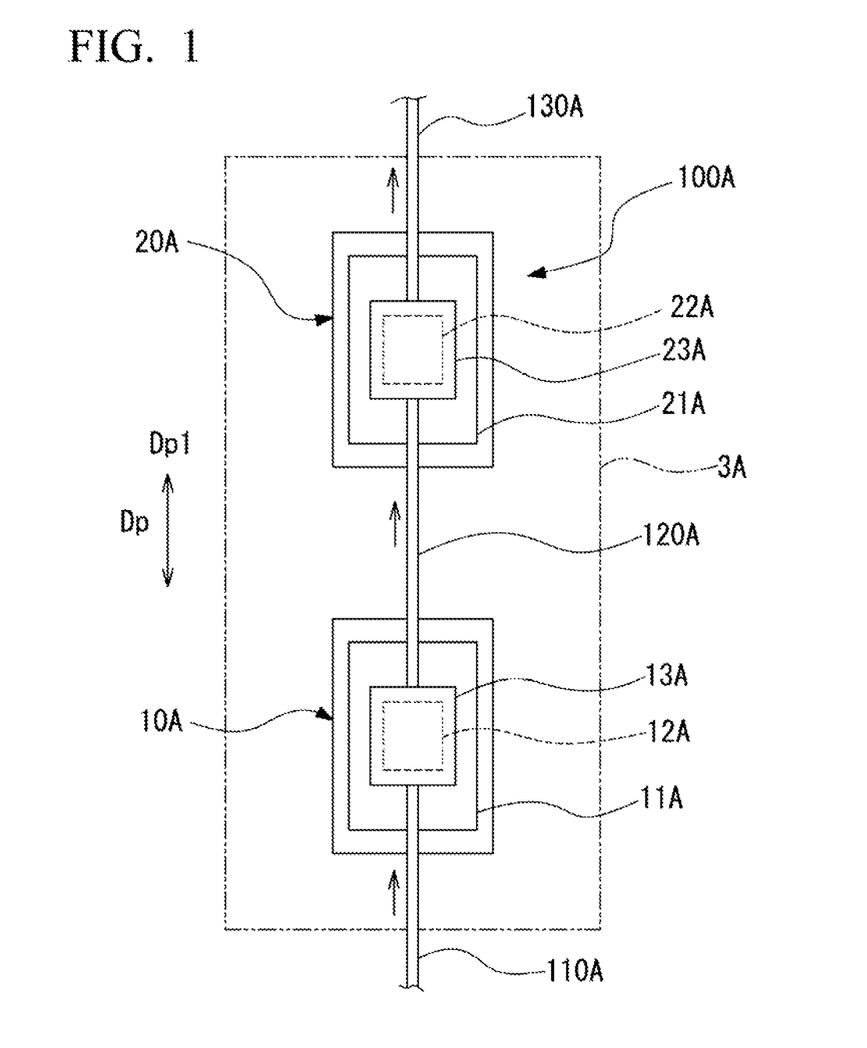
FIG. 1 is a diagram showing a minimum configuration of a cooling system according to a first example embodiment of the present invention.

FIG. 1 is a diagram showing a minimum configuration of a cooling system according to the present example embodiment.

As shown in this figure, a cooling system 100A needs only to be provided with at least a first module 10A, a second module 20A, an upstream side tube 110A, a downstream side tube 120A, and a discharge tube 130A.

The first module 10A is provided in a housing 3A. The first module 10A is provided with a substrate 11A (first substrate), a heat generating member 12A (first heat generating member) mounted on the substrate 11A, and a cooling member 13A for cooling the heat generating member 12A.

The second module 20A is provided in the housing 3A on a first side Dp1 of the housing 3A in the depth direction Dp with respect to the first module 10A. The second module 20A is provided with a substrate 21A (second substrate), a heat generating member 22A (second heat generating member), and a cooling member 23A.

The upstream side tube 110A supplies a cooling medium to the cooling member 13A of the first module 10A from the outside.

The downstream side tube 120A supplies the cooling medium passed through the cooling member 13A of the first module 10A to the cooling member 23A of the second module 20A.

The discharge tube 130A discharges the cooling medium passed through the first module 10A and the second module 20A.

In this cooling system 100A, the first module 10A and the second module 20A are arranged in series along the depth direction Dp of the housing 3A. In addition, the upstream side tube 110A and the downstream side tube 120A are arranged in series in the depth direction Dp of the housing 3A. In such a cooling system 100A, after the cooling medium passes through the upstream side tube 110A and cools the cooling member 13A of the first module 10A, the cooling medium passes through the downstream side tube 120A and cools the cooling member 23A of the second module 20A. As a result, the heat generating member 12A of the first module 10A is cooled by the cooling member 13A. The heat generating member 22A of the second module 20A is cooled by the cooling member 23A. The cooling medium passed through the first module 10A and the second module 20A is discharged to the outside through the discharge tube 130A.

In such a configuration, only a set of the upstream side tube 110A and the discharge tube 130A are led out to the outside of the housing 3A. Therefore, the number of tubes for transporting the cooling medium can be reduced, the cost and the labor for assembling can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

Second Example Embodiment

Figure 2:
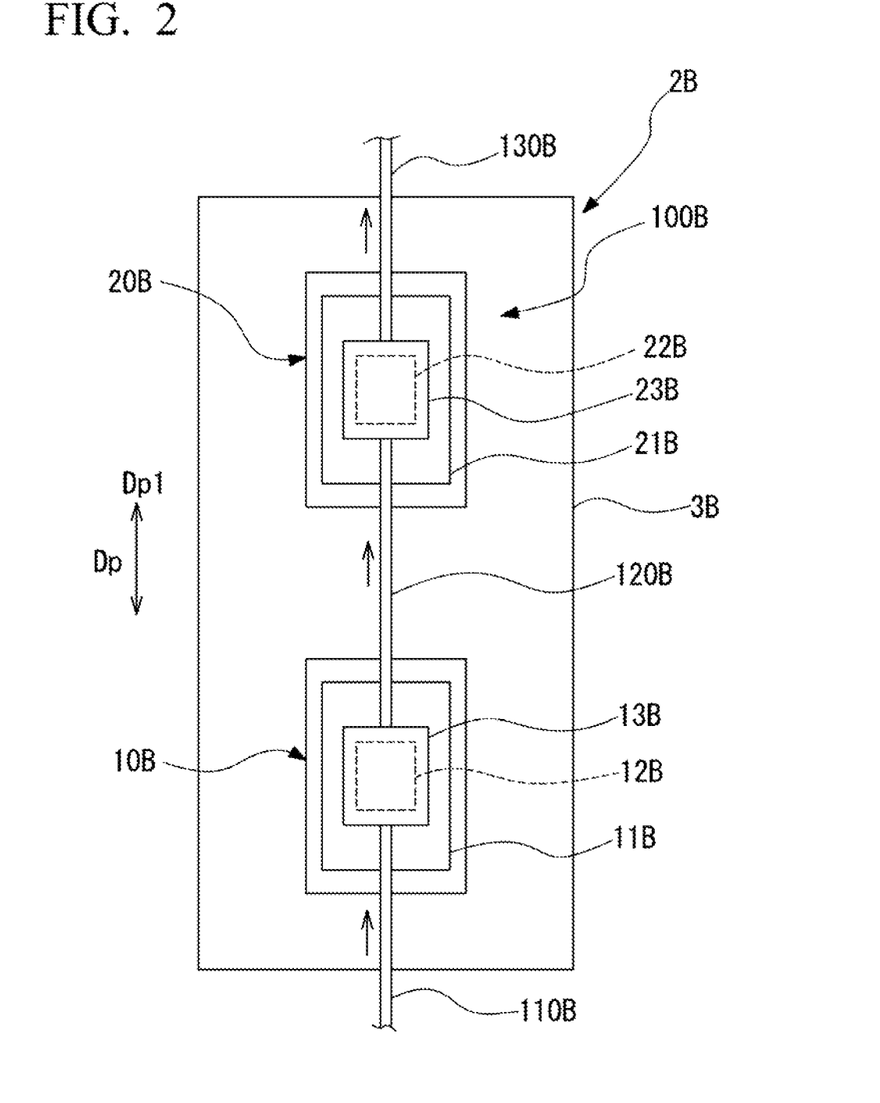
FIG. 2 is a diagram showing a minimum configuration of an electronic device according to a second example embodiment of the present invention.

FIG. 2 is a diagram showing a minimum configuration of an electronic device according to the present example embodiment.

As shown in this figure, an electronic device 2B needs only to be provided with at least a housing 3B and a cooling system 100B. The cooling system 100B is provided with a first module 10B, a second module 20B, an upstream side tube 110B, a downstream side tube 120B, and a discharge tube 130B.

The first module 10B is provided in the housing 3B. The first module 10B is provided with a substrate 11B (first substrate), a heat generating member 12B (first heat generating member) mounted on the substrate 11B, and a cooling member 13B for cooling the heat generating member 12B.

The second module 20B is provided in the housing 3B on the first side Dp1 of the housing 3B in the depth direction Dp with respect to the first module 10B. The second module 20B is provided with a substrate 21B (second substrate), a heat generating member 22B (second heat generating member), and a cooling member 23B.

The upstream side tube 110B supplies a cooling medium to the cooling member 13B of the first module 10B from the outside.

The downstream side tube 120B supplies the cooling medium passed through the cooling member 13B of the first module 10B to the cooling member 23B of the second module 20B.

The discharge tube 130B discharges the cooling medium passed through the first module 10B and the second module 20B.

In this electronic device 2B, the first module 10B and the second module 20B are arranged in series along the depth direction Dp of the housing 3B. In the cooling system 100B, the upstream side tube 110B and the downstream side tube 120B are arranged in series in the depth direction Dp of the housing 3B. In such a cooling system 100B, after the cooling medium passes through the upstream side tube 110B and cools the cooling member 13B of the first module 10B, the cooling medium passes through the downstream side tube 120B and cools the cooling member 23B of the second module 20B. As a result, the heat generating member 12B of the first module 10B is cooled by the cooling member 13B. The heat generating member 22B of the second module 20B is cooled by the cooling member 23B. The cooling medium passed through the first module 10B and the second module 20B is discharged to the outside through the discharge tube 130B.

In such a configuration, only a set of the upstream side tube 110B and the discharge tube 130B are led out to the outside of the housing 3B. Therefore, the number of tubes for transporting the cooling medium can be reduced, the cost and the labor for assembling can be reduced, and the space for providing the tubes can be easily secured. As a result, it is possible to provide the electronic device 2B that can solve the problem that the number of tubes for transporting the cooling medium increases, the cost and the labor for assembling are required, and it is difficult to secure the space for providing the tubes.

Third Example Embodiment

Figure 3:
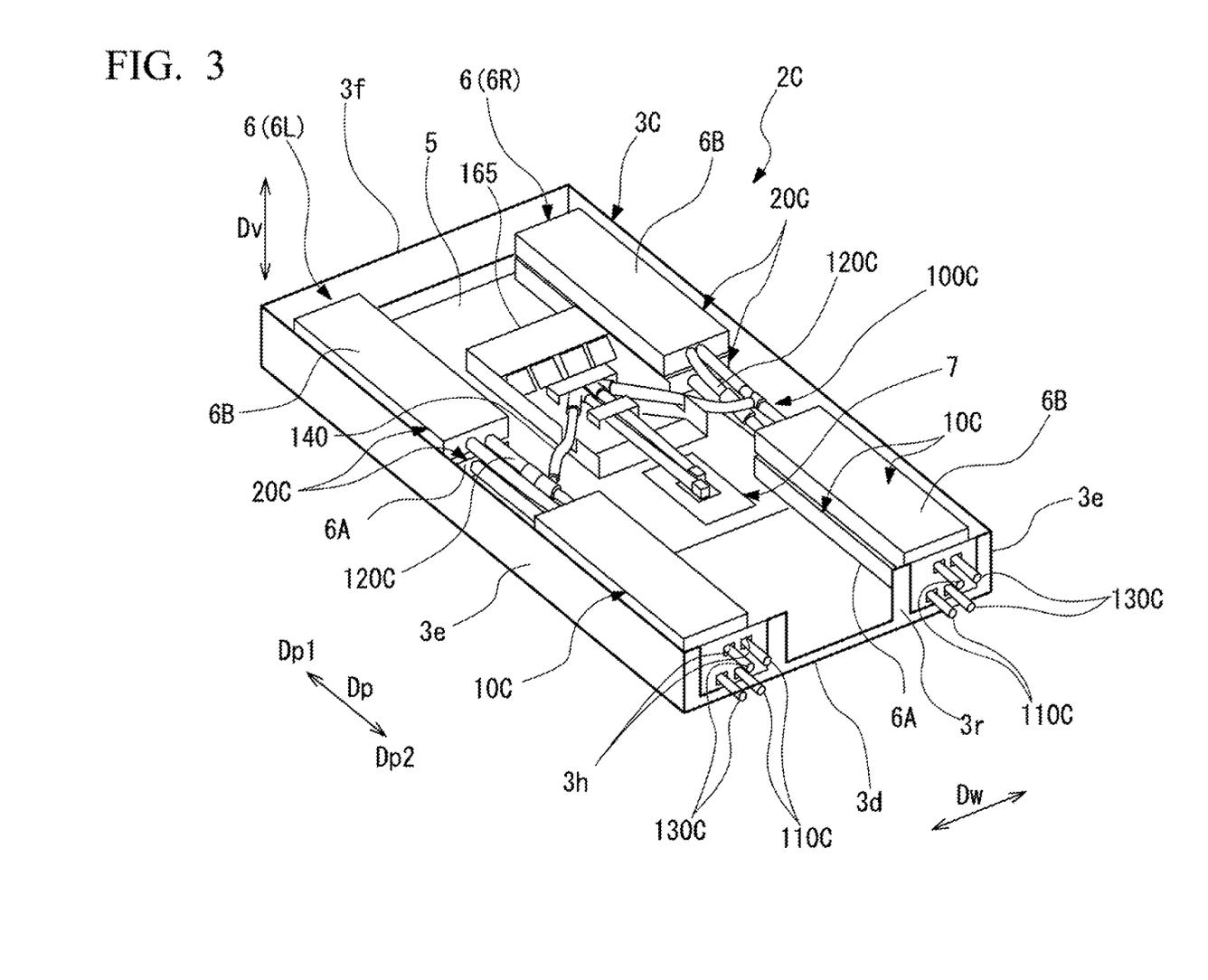
FIG. 3 is a perspective view showing a schematic configuration of an electronic device according to a third example embodiment of the present invention.

FIG. 3 is a perspective view showing a schematic configuration of an electronic device according to the present example embodiment.
(Overall Configuration of Server)

As shown in this figure, a server (electronic device) 2C is provided with a housing 3C, a main substrate 5, side modules 6, and a center module 7. One or more servers 2C are housed in a server rack (not shown) to form a server apparatus (not shown). The server 2C is provided so as to be able to be inserted and removed from the server rack (not shown) along the horizontal direction. In the following description, the insertion and removal direction of the server 2C with respect to the server rack is referred to as the depth direction Dp. In addition, the direction orthogonal to the depth direction Dp in the horizontal plane is referred to as a width direction Dw, and the direction orthogonal to the depth direction Dp and the width direction Dw is referred to as a vertical direction Dv.
(Housing)

The housing 3C is formed in a rectangular shape having a long side in the depth direction Dp when viewed from the vertical direction Dv in a plan view. The housing 3C is provided with at least a bottom plate 3d provided along a horizontal plane and a pair of side plates 3e rising upward from both sides of the bottom plate 3d in the width direction Dw. The housing 3C is provided with a rear panel 3r rising upward from the bottom plate 3d on the second side Dp2 of the bottom plate 3d in the depth direction Dp. Furthermore, the housing 3C may be provided with a front panel 3f on the first side Dp1 of the bottom plate 3d in the depth direction Dp.

(Main Substrate)

The main substrate 5, the side modules 6, and the center module 7 are housed in the housing 3C.

The main substrate 5 has a flat plate shape and is disposed along the bottom plate 3d of the housing 3C. The main substrate 5 is disposed at a central portion in the housing 3C in the width direction Dw.

(Side Module)

The side modules 6 are disposed on both sides of the main substrate 5 in the width direction Dw in the housing 3C. In each side module 6, a lower stage side module portion 6A and an upper stage side module portion 6B are provided so as to be laminated in the vertical direction Dv. Each of the lower stage side module portion 6A and the upper stage side module portion 6B is provided with a first module 10C and a second module 20C.

Figure 4:
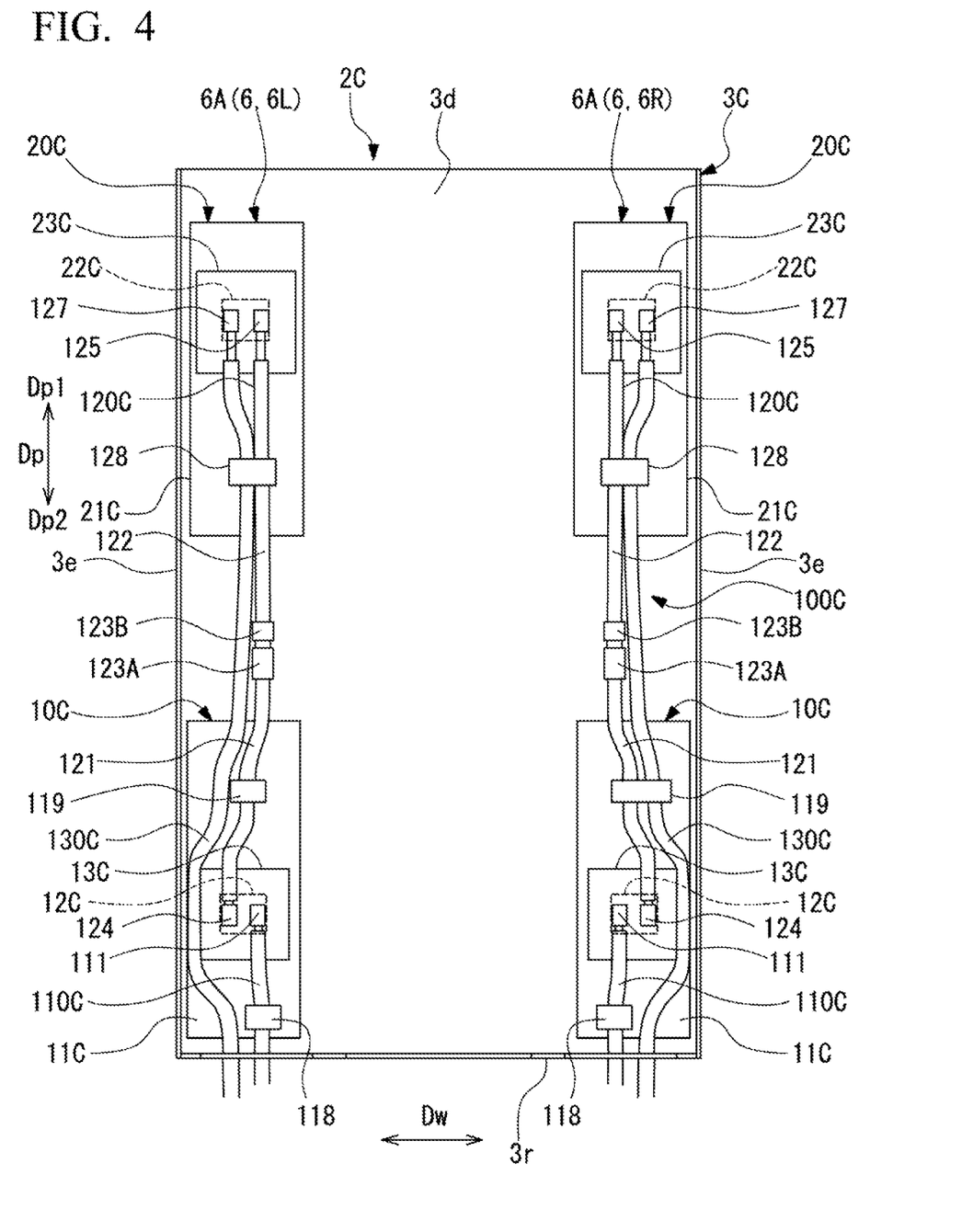
FIG. 4 is a plan view showing side modules on a lower stage side in the electronic device according to the third example embodiment of the present invention.
Figure 5:
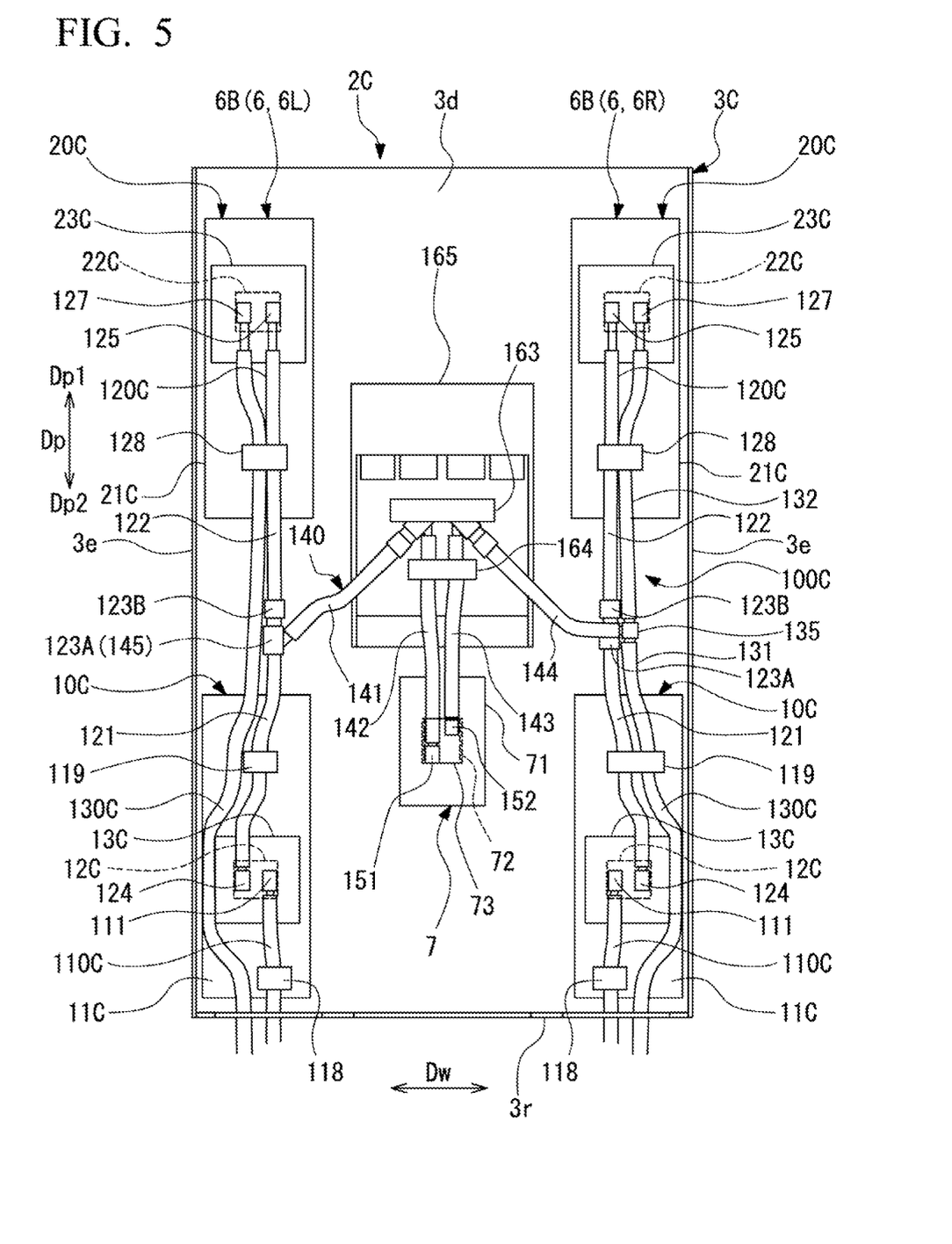
FIG. 5 is a plan view showing side modules on an upper stage side and a center module in the electronic device according to the third example embodiment of the present invention.

FIG. 4 is a plan view showing side modules on a lower stage side in the electronic device according to the present example embodiment. FIG. 5 is a plan view showing side modules on an upper stage side and a center module in the electronic device according to the present example embodiment.

As shown in these figures, the first module 10C is provided in the housing 3C in each of the lower stage side module portion 6A and the upper side stage module portion 6B. The first module 10C is provided with a substrate 11C (first substrate), a central processing unit (CPU, first heat generating member) 12C, and a cooling member 13C.

The substrate 11C has a flat plate shape and is disposed along a horizontal plane. The CPU 12C is mounted on the surface of the substrate 11C. The CPU 12C functions as a processor that executes predetermined processing. The cooling member 13C is provided so as to be laminated on the CPU 12C. The cooling member 13C is made of a metal material and has, for example, a rectangular parallelepiped shape. A space (not shown) into which the cooling medium flows is formed inside the cooling member 13C. A refrigerant inlet (not shown) and a refrigerant outlet (not shown) communicating with the space (not shown) are formed on the upper surface of the cooling member 13C.

The second module 20C is provided in the housing 3C at an interval from the first module 10C on the first side Dp1 of the housing 3C in the depth direction Dp. The second module 20C has the same configuration as that of the first module 10C, and is provided with a substrate 21C (second substrate), a CPU (second heat generating member) 22C, and a cooling member 23C.

The substrate 21C has a flat plate shape and is disposed along a horizontal plane. The CPU 22C is mounted on the surface of the substrate 21C. The CPU 22C functions as a processor that executes predetermined processing. The cooling member 23C is provided so as to be laminated on the CPU 22C. The cooling member 23C is made of a metal material and has, for example, a rectangular parallelepiped shape. A space (not shown) into which the cooling medium flows is formed inside the cooling member 23C. A refrigerant inlet (not shown) and a refrigerant outlet (not shown) communicating with the space (not shown) are formed on the upper surface of the cooling member 23C.

(Center Module)

As shown in FIG. 3, the center module 7 is disposed above the main substrate 5 at intervals from each side module 6 in the width direction Dw. The center module 7 is disposed at substantially the same height as the upper stage side module portions 6B in the vertical direction Dv. As shown in FIG. 5, the center module 7 is provided with a center substrate 71, a center CPU 72, and a center cooling member 73.

The center substrate 71 has a flat plate shape and is disposed along a horizontal plane in parallel with the bottom plate 3d of the housing 3C. The center substrate 71 is supported on the main substrate 5 or the bottom plate 3d via a support member (not shown).

The center CPU 72 is mounted on the surface of the center substrate 71. The center CPU 72 functions as a processor that executes predetermined processing in cooperation with the CPUs 12C and 22C of the plurality of first modules 10C and the plurality of second modules 20C.

The center cooling member 73 is provided so as to be laminated on the center CPU 72. The center cooling member 73 is made of a metal material and has, for example, a rectangular parallelepiped shape. A space (not shown) into which the cooling medium flows is formed inside the center cooling member 73. A refrigerant inlet (not shown) and a refrigerant outlet (not shown) communicating with the space (not shown) are formed on the upper surface of the center cooling member 73.

(Cooling System)

As shown in FIGS. 3 to 5, the server 2C is provided with a cooling system 100C. The cooling system 100C cools the cooling members 13C of the first modules 10C, the cooling members 23C of the second modules 20C, and the center cooling member 73 of the center module 7 with a cooling medium made of a liquid such as water. The cooling system 100C is provided with the first modules 10C, the second modules 20C, upstream side tubes 110C, downstream side tubes 120C, the discharge tubes 130C, and a branch tube 140 (refer to FIG. 5).

(Upstream Side Tube and Downstream Side Tube)

The upstream side tube 110C supplies a cooling medium to the cooling member 13C of the first module 10C from the outside. The upstream side tube 110C is inserted from the outside to the inside of the housing 3C through a tube insertion opening 3h (refer to FIG. 3) formed in the rear panel 3r of the housing 3C. As shown in FIGS. 4 and 5, the upstream side tube 110C extends in the depth direction Dp in the housing 3C. The upstream side tube 110C is connected to the cooling member 13C of the first module 10C from the second side Dp2 in the depth direction Dp. An end portion of the upstream side tube 110C is connected to the refrigerant inlet (not shown) of the cooling member 13C of the first module 10C via an L-shaped connection joint 111. The upstream side tube 110C is fixed to the substrate 11C of the first module 10C by a holder member 118 between the connection joint 111 and the portion inserted into the tube insertion opening 3h. As a result, even when the upstream side tube 110C is, for example, pulled on the side opposite to the connection joint 111 with respect to the holder member 118, it is possible to suppress the external force from reaching the connection joint 111 side.

The downstream side tube 120C supplies the cooling medium passed through the cooling member 13C of the first module 10C to the cooling member 23C of the second module 20C. The downstream side tube 120C is provided so as to extend in the depth direction Dp between the cooling member 13C of the first module 10C and the cooling member 23C of the second module 20C. One end of the downstream side tube 120C is connected to the cooling member 13C of the first module 10C, and the other end of the downstream side tube 120C is connected to the cooling member 23C of the second module 20C. The downstream side tube 120C is provided with a first downstream side tube 121, a second downstream side tube 122, and joints 123A and 123B.

One end portion of the first downstream side tube 121 is connected to a refrigerant outlet (not shown) of the cooling member 13C of the first module 10C via an L-shaped connection joint 124. The connection joint 124 is connected to the cooling member 13C at a position spaced apart from the connection joint 111 of the upstream side tube 110C in the width direction Dw. The joint 123A is provided at the other end portion of the first downstream side tube 121. The first downstream side tube 121 is fixed to the substrate 11C of the first module 10C by a holder member 119 between the connection joint 124 and the joint 123A. As a result, even when the first downstream side tube 121 is, for example, pulled on the joint 123A side, it is possible to suppress the external force from reaching the connection joint 124 side.

One end portion of the second downstream side tube 122 is connected to the refrigerant inlet (not shown) of the cooling member 23C of the second module 20C via an L-shaped connection joint 125. The joint 123B is provided at the other end portion of the second downstream side tube 122. The second downstream side tube 122 is fixed to the substrate 21C of the second module 20C by a holder member 128 between the connection joint 125 and the joint 123B. As a result, even when the second downstream side tube 122 is, for example, pulled on the joint 123B side, it is possible to suppress the external force from reaching the connection joint 125 side.

The joints 123A and 123B are detachably connected to each other. As a result, the joints 123A and 123B detachably connect the first downstream side tube 121 and the second downstream side tube 122.

(Discharge Tube)

The discharge tube 130C discharges the cooling medium passed through the first module 10C and the second module 20C. The discharge tube 130C is inserted into the housing 3C from the outside of the housing 3C through the tube insertion opening 3h formed in the rear panel 3r of the housing 3C. The discharge tube 130C extends in the depth direction Dp in the housing 3C. The discharge tube 130C is connected to the cooling member 23C of the second module 20C from the second side Dp2 in the depth direction Dp. The end portion of the discharge tube 130C is connected to the refrigerant outlet (not shown) of the cooling member 23C of the second module 20C via an L-shaped connection joint 127. The connection joint 127 is connected to the cooling member 23C at a position spaced apart from the connection joint 125 of the second downstream side tube 122 in the width direction Dw. The discharge tube 130C is fixed to the substrate 21C of the second module 20C by the holder member 128 together with the second downstream side tube 122 on the first module 10C side with respect to the connection joint 127. As a result, even when the discharge tube 130C is, for example, pulled on the side opposite to the connection joint 127, it is possible to suppress the external force from reaching the connection joint 127 side.

The discharge tube 130C extends along the upstream side tube 110C and the downstream side tube 120C. When viewed from the second module 20C side, the discharge tube 130C extends from the second module 20C side to the first module 10C side in the depth direction Dp of the housing 3C. The discharge tube 130C passes through the first module 10C and extends to the second side Dp2 in the depth direction Dp along the upstream side tube 110C. The discharge tube 130C is disposed on the side of the cooling member 13C in the width direction Dw when viewed from the vertical direction Dv orthogonal to the surface of the substrate 11C of the first module 10C. The discharge tube 130C is disposed along the side plate 3e of the housing 3C so as to bypass the cooling member 13C (and CPU 12C) of the first module 10C.

(Branch Tube)

Figure 6:
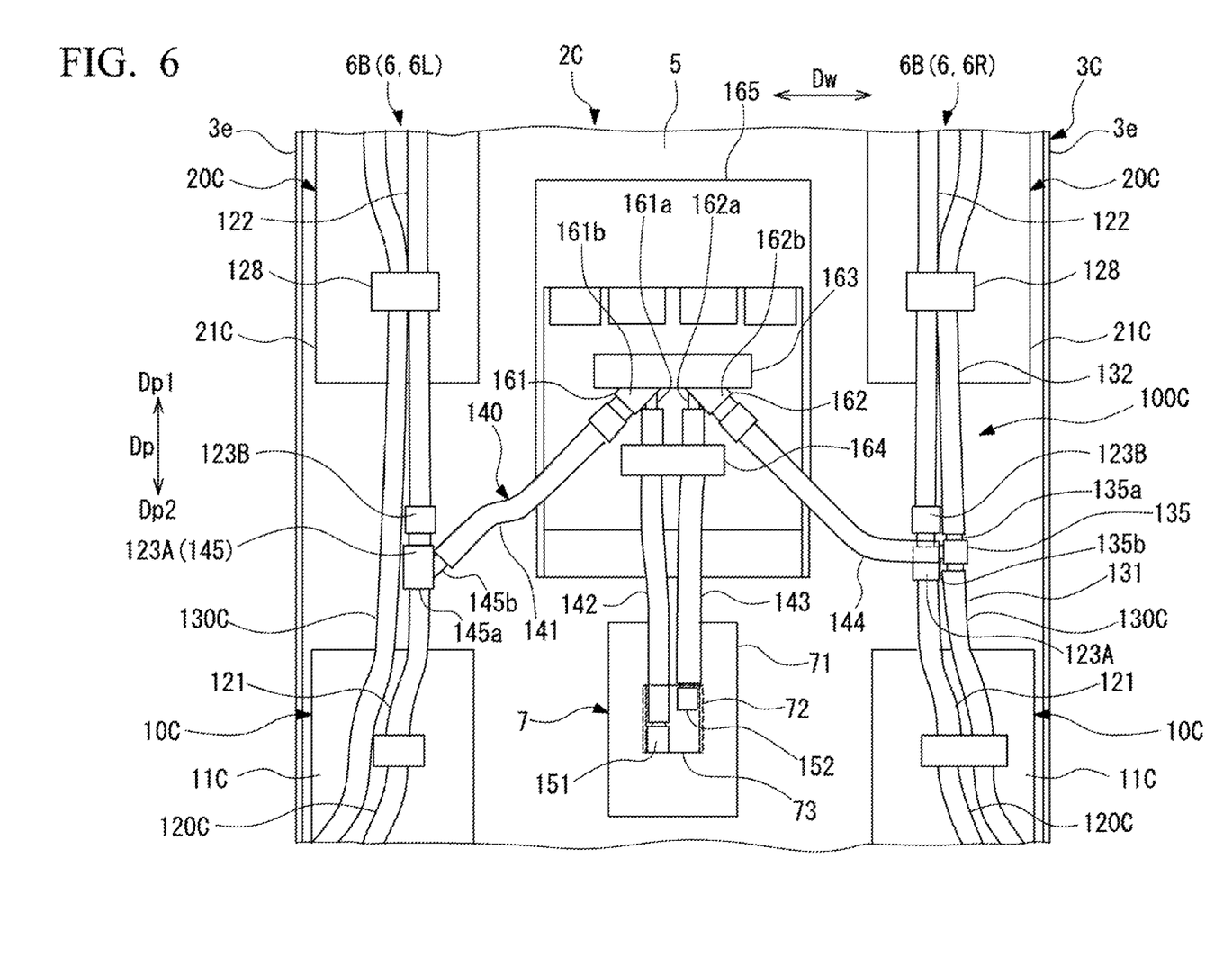
FIG. 6 is a plan view mainly showing a branch tube provided in the side modules on the upper stage side and the center module in the electronic device according to the third example embodiment of the present invention.

FIG. 6 is a plan view mainly showing a branch tube provided in the side modules on the upper stage side and the center module in the electronic device according to the present example embodiment. The branch tube 140 takes out part of the cooling medium from the upper stage side module portion 6B of the side module 6L on one side in the width direction Dw (e.g., left side in FIGS. 5 and 6) in the housing 3C and supplies the part of the cooling medium that has been taken out to the center cooling member 73 of the center module 7. The branch tube 140 sends the cooling medium passed through the center cooling member 73 to the upper stage side module portion 6B of the side module 6R on the other side in the width direction Dw (e.g., right side in FIGS. 5 and 6) in the housing 3C. The branch tube 140 is provided with an upstream side outer branch tube 141, an upstream side inner branch tube 142, a downstream side inner branch tube 143, and a downstream side outer branch tube 144.

The upstream side outer branch tube 141 is provided so as to branch from the downstream side tube 120C. Therefore, a branch joint 145 is used for the joint 123A on the first downstream side tube 121 side. As shown in FIG. 6, the branch joint 145 includes a main tube portion 145a and a branch tube portion 145b. The main tube portion 145a has a tubular shape continuous in the depth direction Dp and is detachably connected to the joint 123B. The branch tube portion 145b branches from the main tube portion 145a and diagonally extends inward in the width direction Dw of the housing 3C toward the first side Dp1 in the depth direction Dp. One end portion of the upstream side outer branch tube 141 is connected to the branch tube portion 145b. The upstream side outer branch tube 141 extends diagonally from the branch joint 145 to the first side Dp1 in the depth direction Dp inward in the width direction Dw of the housing 3C.

One end of the upstream side inner branch tube 142 is connected to the refrigerant inlet (not shown) of the center cooling member 73 of the center module 7 via an L-shaped connection joint 151. The upstream side inner branch tube 142 extends from the connection joint 151 to the first side Dp1 in the depth direction Dp.

The upstream side outer branch tube 141 and the upstream side inner branch tube 142 are connected to each other via a joint member 161. The joint member 161 integrally includes a first connection portion 161a and a second connection portion 161b.

The first connection portion 161a has a tubular shape and extends in the tube axial direction (depth direction Dp) of the upstream side inner branch tube 142. The other end of the upstream side inner branch tube 142 is connected to the first connection portion 161a. The second connection portion 161b has a tubular shape and extends in the tube axial direction (diagonal direction intersecting the width direction Dw and the depth direction Dp) of the upstream side outer branch tube 141. The other end portion of the upstream side outer branch tube 141 is connected to the second connection portion 161*b*. The first connection portion 161*a* and the second connection portion 161*b* communicate with each other.

One end of the downstream side inner branch tube 143 is connected to the refrigerant outlet (not shown) of the center cooling member 73 of the center module 7 via an L-shaped connection joint 152. The connection joint 152 is connected to the center cooling member 73 at a position spaced apart from the connection joint 151 of the upstream side inner branch tube 142 in the width direction Dw. In addition, the connection joint 152 is connected to the center cooling member 73 at a different position with respect to the connection joint 151 of the upstream side inner branch tube 142 in the depth direction Dp. The downstream side inner branch tube 143 extends from the connection joint 152 to the first side Dp1 in the depth direction Dp.

The downstream side outer branch tube 144 is connected to the other end of the downstream side inner branch tube 143 via a joint member 162. The downstream side outer branch tube 144 extends diagonally from the joint member 162 to the second side Dp2 in the depth direction Dp toward the outside of the housing 3C in the width direction Dw.

The joint member 162 integrally includes a first connection portion 162*a* and a second connection portion 162*b*. The first connection portion 162*a* has a tubular shape and extends in the tube axial direction (depth direction Dp) of the downstream side inner branch tube 143. The other end of the downstream side inner branch tube 143 is connected to the first connection portion 162*a*. The second connection portion 162*b* has a tubular shape and extends in the tube axial direction (diagonal direction intersecting the width direction Dw and the depth direction Dp) of the downstream side outer branch tube 144. One end portion of the downstream side outer branch tube 144 is connected to the second connection portion 162*b*. The first connection portion 162*a* and the second connection portion 162*b* communicate with each other. Such a joint member 162 has the same configuration as the joint member 161 and is configured to include common components.

The other end of the downstream side outer branch tube 144 is connected to the discharge tube 130C provided in the upper stage side module portion 6B of the side module 6R on the other side in the width direction Dw via a merging joint 135. The discharge tube 130C provided in the upper stage side module portion 6B of the side module 6R is provided with a first discharge tube 131 on the first module 10C side and a second discharge tube 132 on the second module 20C side. The merging joint 135 is provided between an end portion of the first discharge tube 131 and an end portion of the second discharge tube 132.

The merging joint 135 includes a main tube portion 135*a* and a branch tube portion 135*b*. The main tube portion 135*a* has a tubular shape continuous in the depth direction Dp, and both end portions thereof are connected to the first discharge tube 131 and the second discharge tube 132. The branch tube portion 135*b* branches from the main tube portion 135*a* at the intermediate portion of the main tube portion 135*a* and extends inward in the width direction Dw of the housing 3C. The other end of the downstream side outer branch tube 144 is connected to the branch tube portion 135*b*.

The above joint member 161 and the joint member 162 are fixed to a joint holder 163. In addition, the upstream side inner branch tube 142 and the downstream side inner branch tube 143 are fixed to a branch tube holder 164 between the connection joints 151 and 152 and the joint members 161 and 162. The joint holder 163 and the branch tube holder 164 are provided on a hood member 165. The hood member 165 is fixed to the main substrate 5.

(Flow of Cooling Medium)

In such a cooling system 100C, the cooling medium flows in each of the lower stage side module portions 6A and the upper stage side module portions 6B of the side modules 6 (6L, 6R) on both sides in the width direction Dw as follows.

The cooling medium flows into the upstream side tube 110C from a cooling medium supply tube (not shown) provided outside the housing 3C. The cooling medium flows into the space (not shown) from the refrigerant inlet (not shown) of the cooling member 13C of the first module 10C through the upstream side tube 110C to cool the cooling member 13C. As a result, the heat of the CPU 12C on which the cooling member 13C is laminated is taken away, and the temperature rise of the CPU 12C is suppressed. The cooling medium that flows out from the space (not shown) of the cooling member 13C through the refrigerant outlet (not shown) flows into the space (not shown) from the refrigerant inlet (not shown) of the cooling member 23C of the second module 20C via the downstream side tube 120C to cool the cooling member 23C. As a result, the heat of the CPU 22C of the second module 20C on which the cooling member 23C is laminated is taken away, and the temperature rise of the CPU 22C is suppressed. The cooling medium passed through the first module 10C and the second module 20C in this manner flows from the space (not shown) of the cooling member 23C through the refrigerant outlet (not shown) into the discharge tube 130C. The cooling medium is discharged to a cooling medium discharge tube (not shown) provided outside the housing 3C through the discharge tube 130C.

In addition, in the upper stage side module portion 6B of the side module 6L on one side in the width direction Dw, part of the cooling medium flowed into the first downstream side tube 121 of the downstream side tube 120C via the cooling member 13C of the first module 10C is diverted to the branch tube 140 through the branch joint 145. In the branch joint 145, the cooling medium flowing through the first downstream side tube 121 is divided to the main tube portion 145*a* and the branch tube portion 145*b*. The cooling medium flowed into the branch tube portion 145*b* flows into the space (not shown) from the refrigerant inlet (not shown) of the center cooling member 73 of the center module 7 through the upstream side outer branch tube 141, the joint member 161, and the upstream side inner branch tube 142 to cool the center cooling member 73. As a result, the heat of the center CPU 72 on which the center cooling member 73 is laminated is taken away, and the temperature rise of the center CPU 72 is suppressed. The cooling medium flowing out from the space (not shown) of the center cooling member 73 through the refrigerant outlet (not shown) flows into the branch tube portion 135*b* of the merging joint 135 through the downstream side inner branch tube 143, the joint member 162, and the downstream side outer branch tube 144. The cooling medium merges with the flow of the cooling medium in the main tube portion 135*a* from the branch tube portion 135*b* and flows into the first discharge tube 131 of the discharge tube 130C. The cooling medium is discharged to the cooling medium discharge tube (not shown) provided outside the housing 3C through the discharge tube 130C provided in the upper stage side module portion 6B of the side module 6R on the other side in the width direction Dw.

In this cooling system 100C, the first module 10C and the second module 20C of the server 2C are arranged in series along the depth direction Dp of the housing 3C. In the cooling system 100C for cooling the first module 10C and the second module 20C, the upstream side tube 110C and the downstream side tube 120C are arranged in series in the depth direction Dp of the housing 3C.

In such a configuration, for a set of the first module 10C and the second module 20C arranged in series, only a set of the upstream side tube 110C and the discharge tube 130C are led out to the outside of the housing 3C. Therefore, the number of tubes for transporting the cooling medium can be reduced, the cost and the labor for assembling can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

In this cooling system 100C, the discharge tube 130C extends from the second module 20C side to the first module 10C side in the depth direction Dp of the housing 3C along the upstream side tube 110C and the downstream side tube 120C.

In this configuration, the discharge tube 130C, the upstream side tube 110C, and the downstream side tube 120C are disposed on the same side with respect to the second module 20C (second side Dp2 in the depth direction Dp). That is, the discharge tube 130C, the upstream side tube 110C, and the downstream side tube 120C are led out from the second side Dp2 in the depth direction Dp of the housing 3C to the outside. Therefore, the discharge tube 130C does not protrude on the first side Dp1 in the depth direction Dp of the housing 3C, and the discharge tube 130C, the upstream side tube 110C, and the downstream side tube 120C can be collectively disposed on the second side Dp2 in the depth direction Dp of the housing 3C.

In this cooling system 100C, the discharge tube 130C is disposed on the side of the cooling member 13C when viewed from a direction orthogonal to the surface of the substrate 11C of the first module 10C.

In this configuration, the discharge tube 130C is not laminated on the CPU 12C and the cooling member 13C and is disposed so as to bypass the CPU 12C and the cooling member 13C. As a result, it is possible to suppress the dimensions inside the housing 3C in the direction orthogonal to the surface of the substrate 11C.

In this cooling system 100C, the upstream side tube 110C extends in the depth direction Dp and is connected to the cooling member 13C of the first module 10C on the second side Dp2 in the depth direction Dp, and the downstream side tube 120C extends in the depth direction Dp between the cooling member 13C of the first module 10C and the cooling member 23C of the second module 20C.

In this configuration, the upstream side tube 110C and the downstream side tube 120C extend in the depth direction Dp of the housing 3C and can sequentially supply the cooling medium to the cooling member 13C of the first module and the cooling member 23C of the second module arranged in series along the depth direction Dp.

In this cooling system 100C, the downstream side tube 120C is provided with the first downstream side tube 121, the second downstream side tube 122, and the joint 123A and the joint 123B provided between the first downstream side tube 121 and the second downstream side tube 122.

In this configuration, the first downstream side tube 121 is connected on the first module 10C side, and the second downstream side tube 122 is connected on the second module 20C side. The first downstream side tube 121 and the second downstream side tube 122 are detachably connected to each other by the joints 123A and 123B. As a result, the first downstream side tube 121 and the second downstream side tube 122 can be separated from each other at the joints 123A and 123B, if necessary. Therefore, only one of the first module 10C and the second module 20C can be removed for maintenance, replacement, and the like. At this time, the discharge tube 130C is connected only to the second module 20C, and thus there is no problem when removing the first module 10C or the second module 20C.

In this cooling system 100C, the discharge tube 130C extends in the depth direction Dp and is connected to the cooling member 23C of the second module 20C from the second side Dp2 in the depth direction Dp.

In this configuration, the downstream side tube 120C and the discharge tube 130C are disposed on the same side (second side Dp2 in the depth direction Dp) with respect to the cooling member 23C of the second module 20C. As a result, the cooling medium passed through the first module 10C and the second module 20C toward the first side Dp1 in the depth direction Dp returns from the second module 20C to the second side Dp2 in the depth direction Dp and flows.

The server 2C is provided with the housing 3C and the above cooling system 100C.

In this configuration, it is possible to provide the server 2C provided with the cooling system 100C that can solve the problem that the number of tubes for transporting the cooling medium increases, the cost and the labor for assembling are required, and it is difficult to secure the space for providing the tubes.

Modification Examples of Example Embodiments

In the third example embodiment, the first module 10C and the second module 20C are provided on both sides in the width direction Dw in the housing 3C, and the CPUs 12C and 22C and the cooling members 13C and 23C are provided on the upper side with respect to the substrates 11C and 21C, respectively. However, the arrangement of the CPUs 12C and 22C and the cooling members 13C and 23C is not limited thereto.

Figure 7:
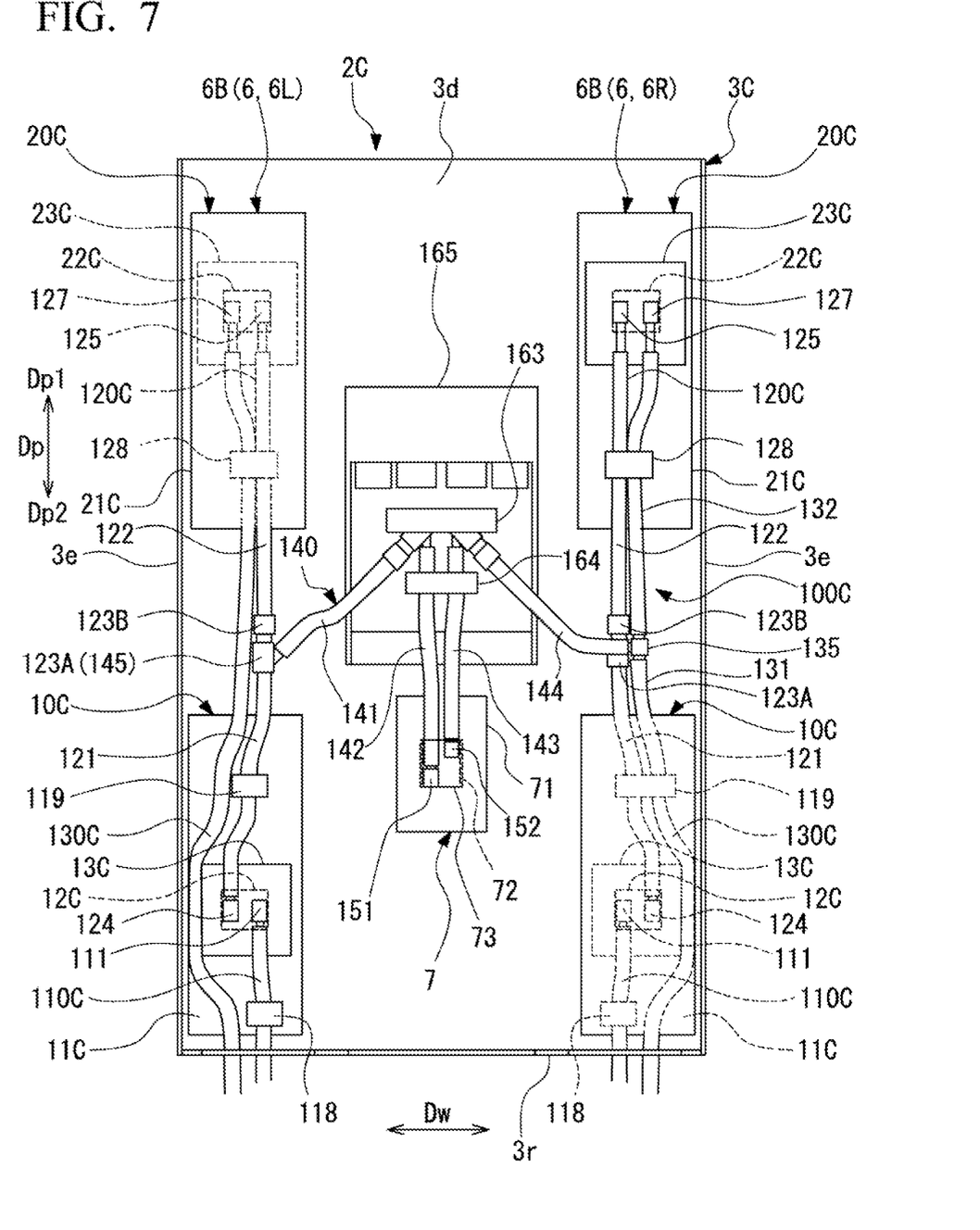
FIG. 7 is a plan view showing a modification example of an electronic device according to an example embodiment of the present invention.

For example, as shown in FIG. 7, the first module 10C and the second module 20C on one side in the width direction Dw and the first module 10C and the second module 20C on the other side in the width direction Dw may be provided upside down in the vertical direction Dv. That is, in the first module 10C on one side in the width direction Dw and the second module 20C on the other side in the width direction Dw, the CPUs 12C and 22C, the cooling members 13C and 23C, the upstream side tube 110C, the downstream side tube 120C, and the discharge tube 130C are disposed on the upper side with respect to the substrates 11C and 21C. In the first module 10C on the other side in the width direction Dw and the second module 20C on one side in the width direction Dw, the CPUs 12C and 22C, the cooling members 13C and 23C, the upstream side tube 110C, the downstream side tube 120C, and the discharge tube 130C are disposed on the lower side with respect to the substrates 11C and 21C.

In addition, the substrate 11C, the CPU 12C, and the cooling member 13C in the first module 10C on the second side Dp2 in the depth direction Dp, and the substrate 21C, the CPU 22C, and the cooling member 23C in the second module 20C on the first side Dp1 in the depth direction Dp may be provided upside down in the vertical direction Dv.

With such a configuration, a module component formed of an aggregate of the substrates 11C and 21C, the CPUs 12C and 22C, and the cooling members 13C and 23C constituting the first module 10C and the second module 20C can be shared between one side and the other side in the width direction Dw, and the first side Dp1 and the second side Dp2 in the depth direction Dp.

In addition, in the third example embodiment, the first modules 10C and the second modules 20C are provided on both sides in the width direction Dw in the housing 3C. However, the arrangement of the first modules 10C and the second modules 20C is not limited thereto. Only one set of the first module 10C and the second module 20C may be provided in series in the depth direction Dp only on one side of the housing 3C in the width direction Dw or only in a central portion in the width direction Dw. Furthermore, three or more sets of the first module 10C and the second module 20C provided in series in the depth direction Dp may be provided in the width direction Dw in the housing 3C.

In addition, in the third example embodiment, the first module 10C and the second module 20C provided in series in the depth direction Dp are provided in two stages in the vertical direction Dv. However, the arrangement of the first modules 10C and the second modules 20C is not limited thereto. The first module 10C and the second module 20C provided in series in the depth direction Dp may be provided in only one stage or in three or more stages in the vertical direction Dv.

Furthermore, in the third example embodiment, the center module 7 and the branch tube 140 are provided in the housing 3C, but the center module 7 and/or the branch tube 140 may not be provided.

In addition, in the first to third example embodiments, the first modules 10A to 10C and the second modules 20A to 20C are provided in series in the depth direction Dp, but three or more modules may be provided in series in the depth direction Dp.

In addition, the applications, component configurations, number of equipment, and the like of the cooling systems 100A to 100C, the electronic device 2B, and the server 2C shown in the first to third example embodiments are not limited at all.

In addition to this, as long as it does not deviate from the gist of the present invention, it is possible to select the configuration described in the above example embodiments or change the configuration to another configuration as appropriate.

This application is based upon and claims the benefit of priority from Japanese Patent Application No. 2019-205337 filed on Nov. 13, 2019, the disclosure of which is incorporated herein in its entirety by reference.

INDUSTRIAL APPLICABILITY

The present invention can be applied to, for example, an electronic device provided with a cooling member for cooling a heat generating member. According to the present invention, the number of tubes can be reduced.

DESCRIPTION OF REFERENCE SIGNS

2B: Electronic device
2C: Server (electronic device)
3A, 3B, 3C: Housing
10A, 10B, 10C: First module
11A, 11B, 11C: Substrate
12A, 12B: Heat generating member
12C: CPU (heat generating member)
13A, 13B, 13C: Cooling member
20A, 20B, 20C: Second module
21A, 21B, 21C: Substrate
22A, 22B: Heat generating member
22C: CPU (heat generating member)
23A, 23B, 23C: Cooling member
100A, 100B, 100C: Cooling system
110A, 110B, 110C: Upstream side tube
120A, 120B, 120C: Downstream side tube
121: First downstream side tube
122: Second downstream side tube
123A, 123B: Joint
130A, 130B, 130C: Discharge tube
Dp: Depth direction
Dp1: First side
Dp2: Second side

What is claimed is:

1. A cooling system comprising:
a first module provided in a housing and provided with a first substrate, a first heat generating member mounted on the first substrate, and a cooling member that cools the first heat generating member;
a second module provided on a first side of the housing in a depth direction with respect to the first module in the housing and provided with a second substrate, a second heat generating member mounted on the second substrate, and a cooling member that cools the second heat generating member;
an upstream side tube configured to supply a cooling medium to the cooling member of the first module from an outside;
a downstream side tube configured to supply the cooling medium passed through the cooling member of the first module to the cooling member of the second module; and
a discharge tube configured to discharge the cooling medium passed through the first module and the second module,
wherein the discharge tube extends along the upstream side tube and the downstream side tube,
a part of the discharge tube is arranged on a side of the cooling member of the first module, and bypasses the cooling member and the first heat generating member of the first module,
the downstream side tube includes a first downstream side tube connected to the first module via a first connection joint, and a second downstream side tube connected to the second module via a second connection joint,
the first downstream side tube and the second downstream side tube are detachably connected to each other via a first joint and a second joint,
the first downstream side tube is fixed to the first substrate by a first holder member between the first connection joint and the first joint, and
the second downstream side tube is fixed to the second substrate by a second holder member between the second connection joint and the second joint.

2. The cooling system according to claim 1, wherein the discharge tube extends from a second module side to a first module side in the depth direction of the housing along the upstream side tube and the downstream side tube.

3. The cooling system according to claim 2, wherein the discharge tube is disposed on the side of the cooling member of the first module when viewed from a direction orthogonal to a surface of the first substrate of the first module.

4. The cooling system according to claim 1, wherein the upstream side tube extends in the depth direction and is connected to the cooling member of the first module from a second side in the depth direction, and
the downstream side tube extends in the depth direction between the cooling member of the first module and the cooling member of the second module.

5. The cooling system according to claim 4, wherein the discharge tube extends in the depth direction and is connected to the cooling member of the second module from a second side in the depth direction.

6. An electronic device comprising:
   the housing; and
   the cooling system according to claim 1.

* * * * *